United States Patent
Freund et al.

[11] Patent Number: 6,165,310
[45] Date of Patent: Dec. 26, 2000

[54] APPARATUS AND METHOD FOR REMOVING PARTS FROM AN ADHESIVE FILM

[75] Inventors: Joseph M. Freund, Fogelsville; George J. Przybylek, Douglassville; Dennis M. Romero, Allentown, all of Pa.

[73] Assignee: Lucent Technologies Inc., Murray Hill, N.J.

[21] Appl. No.: 09/163,055

[22] Filed: Sep. 29, 1998

[51] Int. Cl.⁷ ...................................................... B32B 35/00
[52] U.S. Cl. ........................ 156/344; 156/584; 29/426.6; 438/464; 438/976
[58] Field of Search ..................... 156/344, 584; 29/426.1, 426.5, 426.6; 438/464, 976, FOR 386

[56] References Cited

U.S. PATENT DOCUMENTS

| | | | |
|---|---|---|---|
| 4,990,051 | 2/1991 | Safabakhsh et al. | 156/344 |
| 5,827,394 | 10/1998 | Lu | 156/344 |
| 5,899,730 | 10/1998 | Freund et al. | 438/464 |
| 6,039,833 | 3/2000 | Freund et al. | 156/344 |

*Primary Examiner*—Mark A. Osele
*Attorney, Agent, or Firm*—Darby & Darby

[57] ABSTRACT

An apparatus and method for demounting parts from the adhesive upper surface of a film has a base with a tool mounted thereon. A portion of the tool has a fluted surface extending above the base upper surface. The film lower surface is positioned above the base with a part on the film overlying and opposite the fluted surface of the tool. A vacuum is supplied through at least one passage in the base to the film lower surface to draw the film around and over the tool flute and force the part to at least partially separate from the film adhesive upper surface. The part that has been separated from the adhesive upper surface of the film is stripped from the film adhesive upper surface such as by applying a vacuum force directly to the part through a collet and moving the collet and base relative to one another.

11 Claims, 4 Drawing Sheets

FIG. 4A  FIG. 4B  FIG. 4C
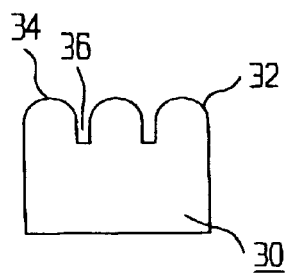  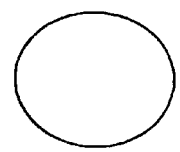
FIG. 5A  FIG. 5B  FIG. 5C
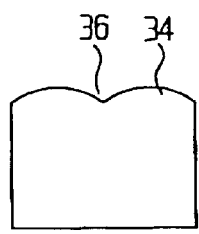  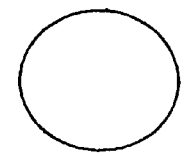
FIG. 6A  FIG. 6B  FIG. 6C
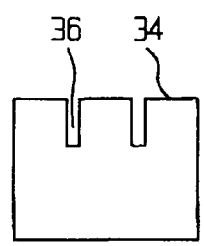  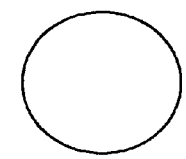
FIG. 7A  FIG. 7B  FIG. 7C
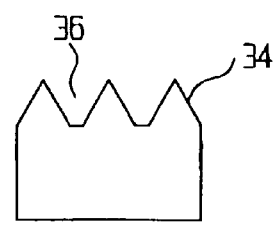  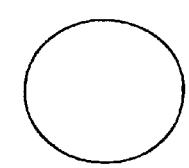

APPARATUS AND METHOD FOR REMOVING PARTS FROM AN ADHESIVE FILM

FIELD OF THE INVENTION

The present invention relate to a tool and method for removing small and fragile parts from an adhesive film on which they are mounted.

BACKGROUND OF THE INVENTION

In various manufacturing processes, fragile parts must be handled on a relatively high-speed basis. A typical manufacturing process would include one in which semiconductor parts are handled. In one application, there is a piece of adhesive film with a plurality of the parts mounted spaced apart on the adhesive surface. The parts must be individually demounted, or stripped, from the film for further processing, testing and packaging without damaging them.

A typical example is the removal of semiconductor laser parts, in the form of bars, from an adhesive film. Such parts are very fragile and are often damaged when removed from the adhesive film using manual and various type of automated handling techniques. One practice employed in removing such parts from an adhesive film employs the use of a needle to push up on the lower surface of the film at a single contact point to separate the part from the adhesive on the upper surface of the film. A vacuum tool applied to the part then strips the portion of the part not separated from the adhesive by the push of the needle away from the adhesive. This process must be carefully adjusted in order to be able to repeat the removal of the parts without damaging them by the needle impact.

In one approach, an adhesive film holding the parts is placed on a static elevator and a vacuum force is applied to the parts so as to directly remove them from the film. This other technique has been successful with a vinyl film which has a relatively low coefficient of adhesion. While the process described in that application reduces the possibility of damaging the parts, there is a drawback n that process in that the parts can only be demounted from films having low adhesion. That is, when films having a more tacky adhesive are used for mounting the parts, the parts cannot be easily and safely removed using this other process.

SUMMARY OF THE INVENTION

The present invention relates to an improved tool and method used to remove fragile and small parts mounted on an adhesive film. The tool includes a rod or bar which is positioned beneath the adhesive film at the location of the part to be removed. The rod or bar is fluted or ridged. A vacuum is drawn against the film lower surface to apply force between the tool and the part through the film. The vacuum force separates the adhesive film from the part in the depressed regions of the tool between the flutes or ridges. A vacuum collet is applied to the top of the part and is moved to demount the part from the adhesive film.

The use of the flutes on the tool reduces the contact area between the part and the adhesive film sufficiently so that the parts can removed from a variety of commercially available films having different adhesive properties that are greater than that of a vinyl film. Using the invention, parts as small as 10–24 mils have been successfully removed without damage.

OBJECTS OF THE INVENTION

It is therefore an object of the present invention to provide a tool and method which permits removal of fragile parts from an adhesive film.

Another object is to provide a tool having flutes that contact the lower surface of a film whose upper surface has an adhesive to which a part is mounted, with a vacuum being applied to the lower surface to draw the film around the flutes of the tool and separate the adhesive surface from the part.

A further object is to provide a tool which reduces the area of surface contact between a part and an adhesive surface of a film on which the part is mounted to permit easy separation of the part from the film.

An additional object is to provide a method for demounting parts secured to an adhesive film in which the film is partially separated from a part by moving the part against the fluted surface of a tool and a vacuum is applied to the partially separated part to demount it from the film.

BRIEF DESCRIPTION OF THE DRAWINGS

Other objects and advantages of the present invention will become more apparent upon reference to the following specification and annexed drawings in which:

FIGS. 4A–4C, 5A–5C, 6A–6C and 7A–7C are respectively a front view of various shapes of flutes and end views of a tool in the form of a bar and a rod on which they are located.

DETAILED DESCRIPTION OF THE INVENTION

Figure 1:
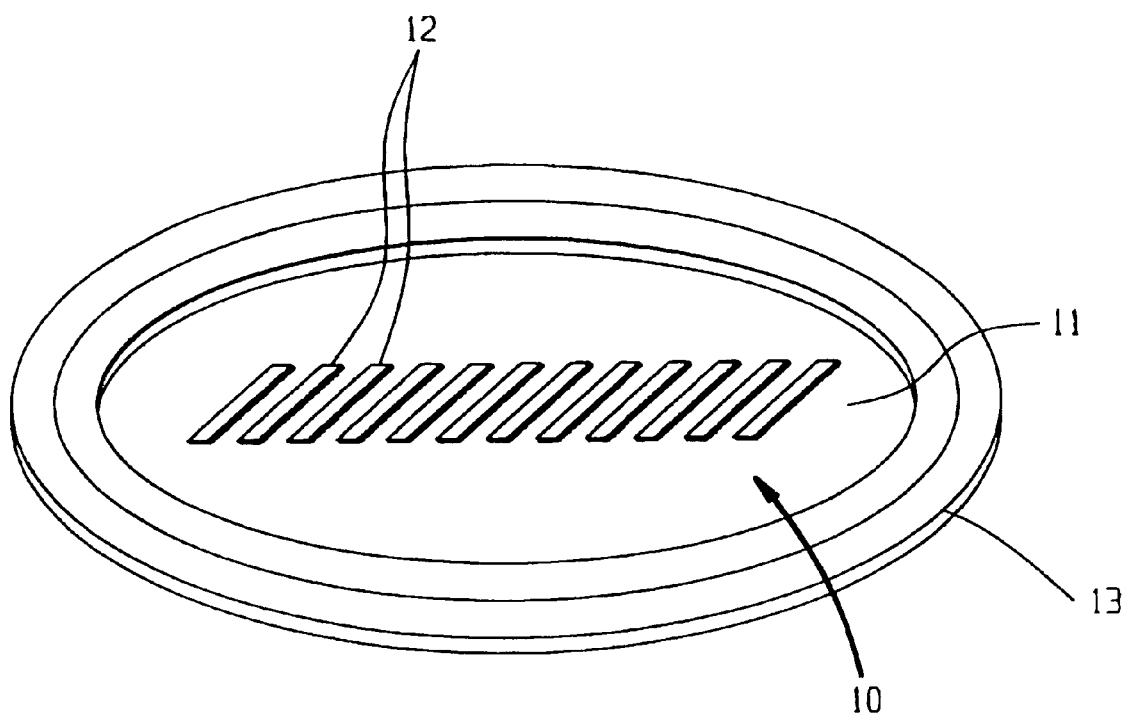
FIG. 1 is a perspective view of a hoop of the adhesive film on which a plurality of parts are mounted.

Referring to FIG. 1, a film 10 is shown that has an adhesive on its upper surface 11. The film is shown as being within a hoop having a peripheral rim 13 that permits easier handling and transport of the film. The film can be of any suitable material, for example vinyl, polyethylene or similar material and the adhesive can be of any suitable type having the required degree of adhesion to hold the parts. Typical thicknesses for the film are in the range of 2–4 mils Mounted on the film adhesive surface 11 are a plurality of parts 12 which are spaced from each other. The parts 12 are of any type used in a conventional manufacturing process. In one typical process, as shown, they are bars of semiconductor laser chips having a dimension of 10×300 mils. With these dimensions for the parts, the film hoop can have a diameter of 7 inches, although any suitable hoop diameter can be used. Also, the invention is not limited to any particular size for the parts 12. With parts of this size, a typical adhesion coefficient for the adhesive is 15 grams.

Figure 2B:
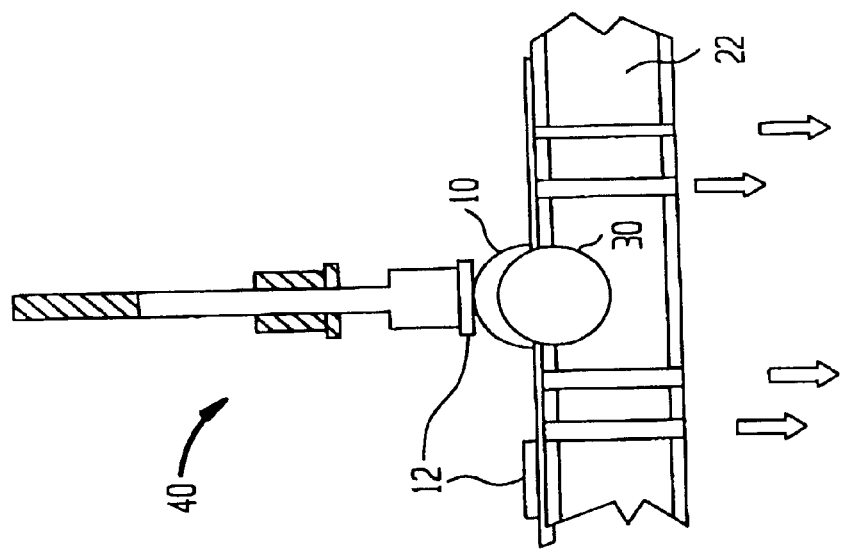
FIG. 2B is a view corresponding to FIG. 2A showing a vacuum applied to the adhesive film lower surface and a vacuum collet for lifting the part from the film adhesive upper surface.
Figure 2A:
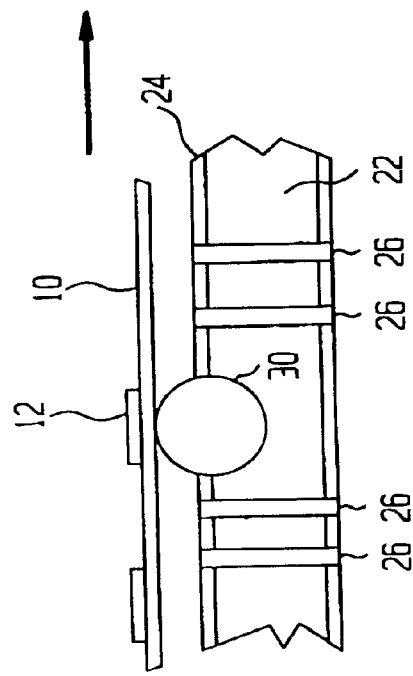
FIG. 2A is an elevational view of a station for the removal of the parts from the film showing an end view of the tool.
Figure 2C:
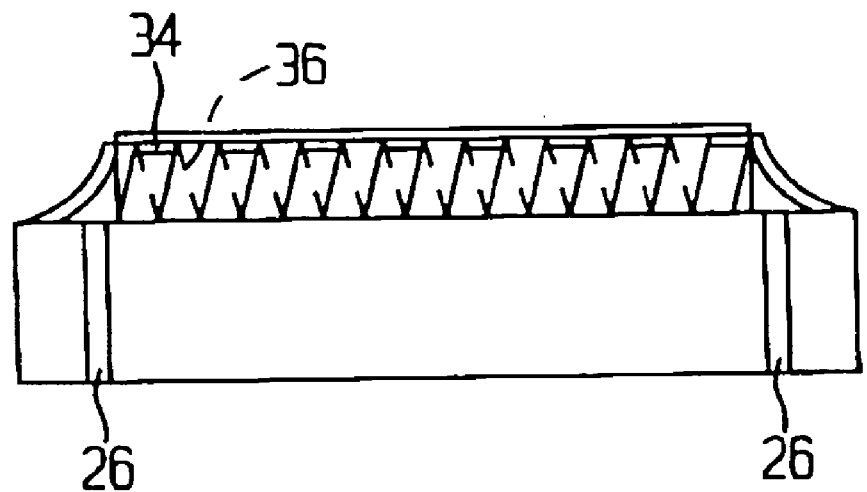
FIG. 2C is a view of the station of FIGS. 2A and 2B turned by 90°.

Referring to FIGS. 2A–2C, the hoop with the film 10 is shown as having been advanced by any suitable mechanism (not shown) to place a part 12n with the film held in tension over a station 20 where the part will be removed from the film 10. The station 20 includes a base 22 of any suitable material, for example, aluminum, plastic and similar materials, having an upper surface 24. A plurality of holes 26 extend through the base 22 from its lower to its upper surface, with the holes being connected to a vacuum source (not shown).

Figure 3:
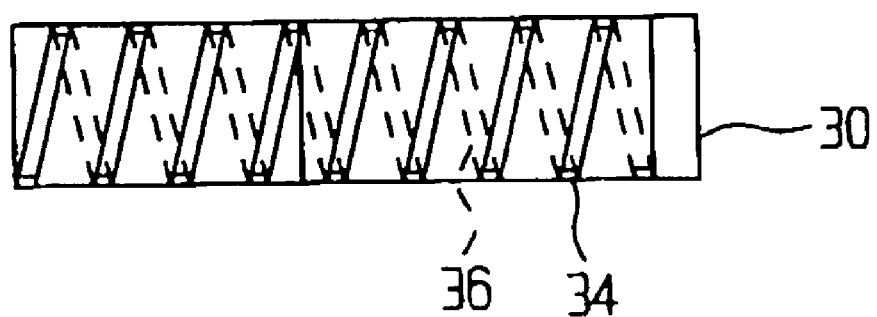
FIG. 3 is a view of a tool in the form of a rod having a fluted surface.

Mounted in the upper portion of the station base 22 is a tool 30, a portion of which extends above the base upper surface 24. As shown in FIG. 2C and FIG. 3, the tool 30 is in the shape of a rod and has a helicoidal flute 32 along its length, or at least along that portion of the rod which extends above the base upper surface 24. As seen in FIG. 2C and FIG. 3, the flute 32 has a raised portion 34 and a depressed portion 36 between two adjacent raised portions.

As seen in FIG. 2A, the film 10 is advanced to a position where a part 12 is located above the tool 30. If the tool 30 is in the shape of a cylindrical rod, its diameter preferably is made greater than the width of a part and its length is longer than that of the part. With these dimensions, the fluted tool will be opposite a substantial portion of the part to be demounted.

Vacuum is supplied through the station base passages 26 which causes, as shown in FIG. 2B, the film 10 to be drawn down, around and over the tool 30 with the film forming a chamber for the vacuum. A typical vacuum pressure for parts 12 of the type being described is 20 inches of Hg. Application of the vacuum also causes force to be applied by the tool flute 32 through the film to the lower surface of the part 12. This causes the portions of the adhesive film not engaged by the flute raised portions 34 to be drawn into the depressions 36. This separates portions of the adhesive surface of the film from the lower surface of the part 12. That is, the adhesive film is separated or detached from a portion of the part.

After the adhesive film has been drawn down, around and over the tool 30, a vacuum collet tool 40 above the part is moved downward to engage, or to fully overlie, the part 12. The collet tool 40 is then move upwardly and the part is demounted from the film 10. During the time of the operation of the vacuum collet 40, the vacuum in the station base passages 26 is preferably maintained.

The fluted surface 32 of the tool 30 performs several functions. First, it provides a relatively large surface area of contact between the tool and the film beneath a part. This provides a more even distribution of force over the entire bottom surface of the part as the vacuum is applied through the base passages 26 to partially separate the adhesive film from the part. It also provides, for example, as compared to the pin removal technique referred to above, a more stable surface for peeling of the part from the adhesive film by the vacuum collet 40 and less of the film adhesive force needs to be overcome because of the separation during the drawing of the film around the tool by the vacuum in base passages 26. The fluted surface permits the use of more tacky adhesives than are used on a vinyl film.

The process of demounting the parts 12 from the adhesive film 10 is carried out on a step-wise basis. That is, after one part is removed from the film by the vacuum collet 40, the film hoop is advanced one step to place the next part over the tool 30. Movement of the film hoop is stopped, the vacuum is applied to the base passages 26 to draw the film over the tool and the vacuum collet is operated to remove the part from the film. While a reciprocating movement of the vacuum collet 40 relative to the part has been described, it should be understood that the collet can be stationary and the base 20 can be moved relative thereto.

In FIGS. 2C and 3, the tool 30 is shown as being a rod with the flute 32 as a single helical or helicoidal coil around the entire surface of the rod or around only the portion extending above the upper surface 24 of the base 22. Other forms of the tool and shapes of the flutes can be used. As shown in each of FIGS. 4B–7B, the tool can be a flat bar, or plate, 40 and each of these figures shows an end view of the bar. Each of FIGS. 5A–7A shows the flute 32 at the top edge of the bar. The flute can be along its length, that is, FIGS. 4A–7A would be a front view of the bar, or transverse thereto, that is, each of FIGS. 4A–7A would be an end view of the bar. In large measure, the orientation of the flute depends upon the dimensions of the parts being removed. Here also, the length and width of the upper edge of the bars should be large enough preferably to support fully a part.

In FIG. 4, the flute 32 is a series of three ridges 34 having curved upper surfaces to face the film lower surface and the part to be removed; in FIG. 5, there are two adjacent curved upper sections; in FIG. 6, there are three rectangular ridges, or crenelations; and in FIG. 7, there are three triangular ridges with the apex of each triangle facing the film lower surface. There is a depressed portion 36 between each two adjacent ridges or crenelations. Other shapes of the flutes can be used.

While the present invention has been shown and described with respect to various embodiments, it will be understood by those skilled in the art that various changes and modifications can be made therein without departing from the spirit and scope of the invention as defined by the appended claims.

We claim:

1. Apparatus for demounting parts from a film having an upper adhesive surface and a lower surface, the parts adhering to the upper adhesive surface, comprising:

a base having an upper surface;

a tool mounted on the base so that a portion of said tool with a fluted surface extends above the upper surface of said base, the lower surface of the film being positioned over the upper surface of the base and the tool such that the fluted surface is opposite a part; and at least one passage extending from an exit at the base upper surface through which a vacuum is applied to draw the film around and over the tool and to force the film lower surface against the fluted surface of the tool so as to separate the part from the film adhesive upper surface of the film.

2. Apparatus as in claim 1 further comprising a device movable relative to said base for engaging the part to remove the part from the film.

3. Apparatus as in claim 2 wherein said device is a vacuum collet.

4. Apparatus as in claim 1 wherein said tool is a rod and said flute is on the outer surface of the rod.

5. Apparatus as in claim 1 wherein said tool is a bar and said flute is along one edge of the bar.

6. Apparatus as in claim 4 wherein said flute is along the length of the rod and is one of a helicoidal or part helicoidal ridge, a plurality of spaced ridges each having a curved edge, a pair of arcuate adjacent sections, a plurality of crenelations, and a plurality of spaced triangular sections with the apex of a triangle facing the film lower surface.

7. Apparatus as in claim 5 wherein said flute is along the length of said bar and is one of a plurality of spaced ridges each having a curved edge, a pair of arcuate adjacent sections, a plurality of crenelations, and a plurality of spaced triangular sections with the apex of a triangle facing the film lower surface.

8. A method for demounting parts from the adhesive upper surface of a film comprising:

providing a base having a tool mounted thereon with a portion having a fluted surface extending above the base upper surface, positioning the film lower surface above the base with a part on said film overlying and opposite the fluted surface of such tool; and supplying a vacuum through at least one passage in said base to the film lower surface to draw the film around and over the fluted surface of such tool to force the part to separate from the film adhesive upper surface.

9. A method as in claim 8 further comprising the step of removing the part that has been separated from the adhesive upper surface of said film.

10. A method as in claim 9 wherein the removing step comprises applying a vacuum force to said part.

11. A method as in claim 10 wherein the vacuum is applied by a collet, and further comprising moving one of said collet and said base relative to the other.

* * * * *